United States Patent
Kyoung et al.

(10) Patent No.: US 9,455,683 B2
(45) Date of Patent: Sep. 27, 2016

(54) PIEZOELECTRIC PIECE FOR PIEZOELECTRIC VIBRATOR AND MANUFACTURING METHOD THEREOF

(71) Applicant: SAMSUNG ELECTRO-MECHANICS CO., LTD., Suwon (KR)

(72) Inventors: Je-Hong Kyoung, Suwon (KR); Ho-Phil Jung, Suwon (KR); Tae-Joon Park, Suwon (KR); Won Han, Suwon (KR); Sung-Wook Kim, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 148 days.

(21) Appl. No.: 14/108,575

(22) Filed: Dec. 17, 2013

(65) Prior Publication Data

US 2015/0061467 A1    Mar. 5, 2015

(30) Foreign Application Priority Data

Aug. 29, 2013   (KR) .......................... 10-2013-0103386

(51) Int. Cl.
*H03H 9/21*   (2006.01)
*H03H 3/02*   (2006.01)

(52) U.S. Cl.
CPC ................ *H03H 9/21* (2013.01); *H03H 3/02* (2013.01); *H03H 2003/026* (2013.01); *Y10T 29/42* (2015.01)

(58) Field of Classification Search
CPC ...... H03H 9/21; H03H 9/215; H03H 9/2468; H03H 9/1021; H03H 2003/026; B06B 1/0659; G01C 19/56
USPC ............................ 310/370; 331/156; 333/200
See application file for complete search history.

(56) References Cited

U.S. PATENT DOCUMENTS

| | | | | |
|---|---|---|---|---|
| 6,768,247 | B2 * | 7/2004 | Kitamura | H03H 9/215 310/370 |
| 6,806,797 | B2 * | 10/2004 | Kikushima | G01C 19/5607 29/25.35 |
| 7,518,291 | B2 * | 4/2009 | Tanaya | H03H 3/04 310/348 |
| 7,863,804 | B2 * | 1/2011 | Tanaya | H03H 9/1021 310/370 |
| 8,432,087 | B2 * | 4/2013 | Yamada | H03H 9/0547 310/370 |
| 8,446,079 | B2 * | 5/2013 | Fang | H03H 9/21 310/370 |
| 8,766,515 | B2 * | 7/2014 | Furuhata | H03H 9/0547 310/370 |
| 2007/0159029 | A1 * | 7/2007 | Aratake | H03H 3/02 310/370 |

(Continued)

FOREIGN PATENT DOCUMENTS

| | | | |
|---|---|---|---|
| JP | 2004007428 A | * | 1/2004 |
| JP | 2006086726 A | * | 3/2006 |
| JP | 2007258918 A | * | 10/2007 |

*Primary Examiner* — J. San Martin
(74) *Attorney, Agent, or Firm* — NSIP Law

(57) ABSTRACT

The present invention presents a piezoelectric piece for a piezoelectric vibrator and a manufacturing method thereof. The piezoelectric piece for a piezoelectric vibrator in accordance with an embodiment of the present invention includes: a base; and a vibrating arm connected to the base and having a groove formed therein. Here, one surface inside the groove includes: a first slope extended from an upper portion of the groove in a lower direction so as to have a first angle; and a second slope extended from a lower portion of the first slope in a lower direction so as to have a second angle that is greater than the first angle, and a rate of a depth of the first slope for a depth of the groove is greater than or equal to 0.5 and less than or equal to 1.

5 Claims, 9 Drawing Sheets

(56) References Cited

U.S. PATENT DOCUMENTS

| | | | |
|---|---|---|---|
| 2008/0297008 A1* | 12/2008 | Yamada | H03H 9/215 310/370 |
| 2009/0015106 A1* | 1/2009 | Tanaya | H03H 9/0595 310/344 |
| 2009/0218917 A1* | 9/2009 | Tanaya | H03H 9/215 310/370 |
| 2009/0289531 A1* | 11/2009 | Fang | H03H 9/21 310/370 |
| 2011/0215680 A1* | 9/2011 | Yamada | H01L 41/04 310/370 |
| 2011/0227458 A1* | 9/2011 | Tanaya | H03H 9/215 310/344 |
| 2012/0223784 A1* | 9/2012 | Tanaya | H03H 9/0514 331/158 |
| 2014/0078870 A1* | 3/2014 | Kobayashi | H03H 9/1021 368/47 |
| 2015/0137900 A1* | 5/2015 | Yamada | H03H 9/215 331/156 |

* cited by examiner

PIEZOELECTRIC PIECE FOR PIEZOELECTRIC VIBRATOR AND MANUFACTURING METHOD THEREOF

CROSS-REFERENCE TO RELATED APPLICATIONS

This application claims the benefit of Korean Patent Application No. 10-2013-0103386, filed with the Korean Intellectual Property Office on Aug. 29, 2013, the disclosure of which is incorporated herein by reference in its entirety.

BACKGROUND

1. Technical Field

The present invention relates to a piezoelectric piece for a piezoelectric vibrator and a manufacturing method thereof.

2. Background Art

A piezoelectric vibrator is an apparatus that is vibrated by a piezoelectric phenomenon when voltage is supplied from an outside and generates a frequency through the vibration. Since it is possible to obtain a stable frequency through the use of the piezoelectric vibrator, the piezoelectric vibrator can be used for various purposes, such as a frequency oscillator, a frequency regulator and a frequency converter.

One of the piezoelectric materials that can be used for the piezoelectric vibrator is crystal, which has excellent piezoelectric characteristics. Moreover, among various types of piezoelectric vibrators, the tuning fork type of piezoelectric vibrator can be formed with a pair of vibrating parts that are arranged in parallel and a base part to which the pair of vibrating parts are fixed. When voltage is supplied to the piezoelectric vibrator, the pair of vibrating parts become closer to or farther from each other, thereby generating a resonance frequency.

The performance of the tuning fork type of piezoelectric vibrator is affected by the distance between electrodes. Specifically, the closer the distance between the electrodes is, the smaller the resistance becomes.

The related art of the present invention is disclosed in Korea Patent Publication No. 10-2013-0061262 (PIEZO VIBRATOR AND METHOD FOR MANUFACTURING THE SAME; laid open on Jun. 11, 2013).

SUMMARY

The present invention provides a piezoelectric piece for a piezoelectric vibrator that has a groove including a first slope and a second slope and a manufacturing method thereof.

An aspect of the present invention features a piezoelectric piece for a piezoelectric vibrator which includes: a base; and a vibrating arm connected to the base and having a groove formed therein, wherein one surface inside the groove includes: a first slope extended from an upper portion of the groove in a lower direction so as to have a first angle; and a second slope extended from a lower portion of the first slope in a lower direction so as to have a second angle that is greater than the first angle. Here, a rate of a depth of the first slope for a depth of the groove can be greater than or equal to 0.5 and less than or equal to 1.

The first angle can be 10° or less.

The other surface inside the groove facing the one surface inside the groove can be formed to include a surface that is vertical from a bottom of the groove.

The groove can be provided in plurality.

The groove can have a protruded part formed on a bottom thereof in such a way that a cross-section of the protruded part becomes wider toward the bottom of the groove.

The groove can be formed on one surface and the other surface of the vibrating arm, respectively.

The shape of the groove formed on the one surface of the vibrating arm can be symmetrical to the shape of the groove formed on the other surface of the vibrating arm.

The number of the grooves formed on the one surface of the vibrating arm can be different from the number of the grooves formed on the other surface of the vibrating arm.

Another aspect of the present invention features a method of manufacturing a piezoelectric piece for a piezoelectric vibrator which includes: providing a piezoelectric material including a base and a vibrating arm extended from the base; forming a mask pattern having a plurality of openings separated and arranged in between both ends in a widthwise direction of the vibrating arm; forming an etching groove in the vibrating arm by etching the vibrating arm in a thickness direction of the vibrating arm, the etching groove corresponding to each of the plurality of openings; and forming a groove in the vibrating arm by etching the etching groove in the thickness direction of the vibrating arm so as to allow adjacent etching grooves to be connected to each other.

The step of forming the groove in the vibrating arm can include forming a first slope, which is extended from an upper portion of the groove in a lower direction so as to have a first angle, and a second slope, which is extended from a lower portion of the first slope in a lower direction so as to have a second angle that is greater than the first angle, on one surface inside the groove.

The step of forming the mask pattern can include: forming a mask layer on the vibrating arm; forming a resist pattern corresponding to a position of the mask pattern on the mask layer; and removing the mask layer excluding the mask pattern.

The step of forming the resist pattern can include: applying photo resist on the mask layer; exposing the photo resist excluding the resist pattern; and removing the photo resist excluding the resist pattern by developing the photo resist.

The step of forming the groove in the vibrating arm can include forming the groove in plurality in the vibrating arm.

The method can also include removing the mask pattern, after the step of forming the groove in the vibrating arm.

The step of forming the groove in the vibrating arm can include forming a protruded part on a bottom of the groove in such a way that a cross-section thereof becomes wider toward the bottom of the groove.

The method can also include removing the protruded part, after the step of forming the groove in the vibrating arm.

The step of forming the groove in the vibrating arm can include forming the groove on one surface and the other surface of the vibrating arm, respectively.

The number of the grooves formed on the one surface of the vibrating arm can be different from the number of the grooves formed on the other surface of the vibrating arm.

DETAILED DESCRIPTION

Figure 1:
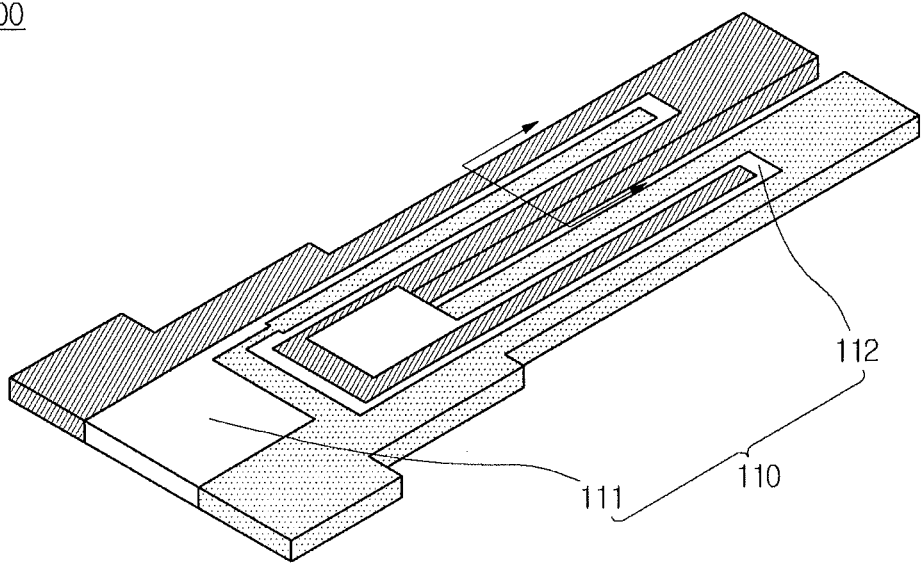
FIG. 1 shows a piezoelectric vibrator of a piezoelectric piece for a piezoelectric vibrator in accordance with an embodiment of the present invention.

Hereinafter, certain embodiments of a piezoelectric piece for a piezoelectric vibrator and a manufacturing method thereof in accordance with the present invention will be described in detail with reference to the accompanying drawings. In describing certain embodiments of the present invention with reference to the accompanying drawings, any identical or corresponding elements will be assigned with same reference numerals, and their redundant description will not be provided.

Terms such as "first" and "second" can be used in describing various elements, but the above elements shall not be restricted to the above terms. The above terms are used only to distinguish one element from the other.

When one element is described as being "coupled" or "connected" to another element, it shall be construed as not only being in physical contact with the other element but also as possibly having a third element interposed therebetween and each of the one element and the other element being in contact with the third element.

Figure 2:
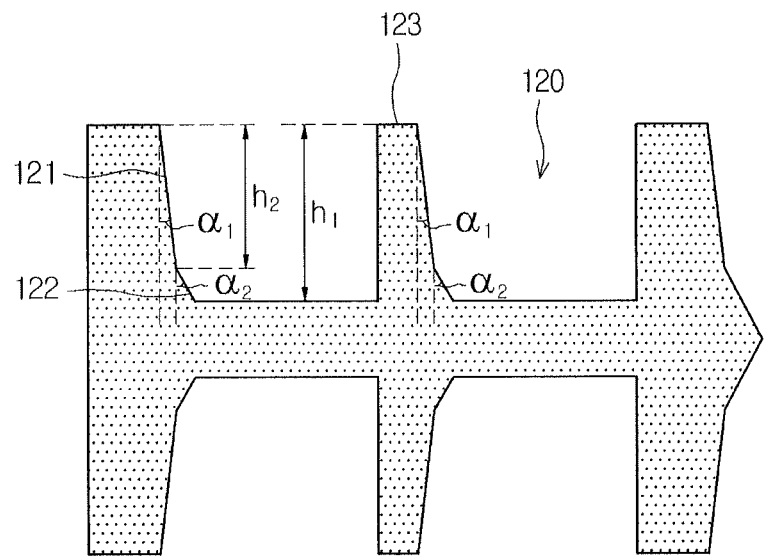
FIG. 2 shows the piezoelectric piece for a piezoelectric vibrator in accordance with an embodiment of the present invention.
Figure 3:
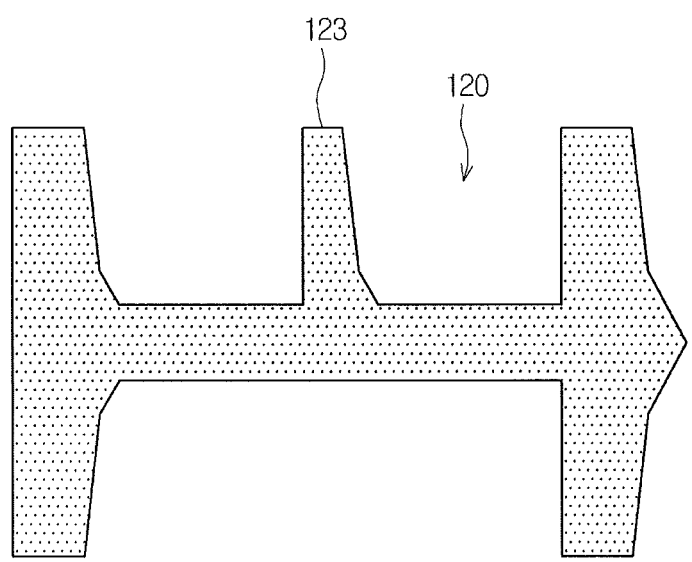
FIG. 3 shows a piezoelectric piece for a piezoelectric vibrator in accordance with another embodiment of the present invention.

FIG. 1 shows a piezoelectric vibrator of a piezoelectric piece for a piezoelectric vibrator in accordance with an embodiment of the present invention. FIG. 2 shows the piezoelectric piece for a piezoelectric vibrator in accordance with an embodiment of the present invention, and FIG. 3 shows a piezoelectric piece for a piezoelectric vibrator in accordance with another embodiment of the present invention.

A piezoelectric vibrator 100 in accordance with an embodiment of the present invention is an oscillator using a piezoelectric element and, as shown in FIG. 1, can be a tuning fork type. The tuning fork type of piezoelectric vibrator 100 can include a piezoelectric piece 110 and an electrode that is formed on the piezoelectric piece 110.

The piezoelectric piece 110 for a piezoelectric vibrator can include a base 111 and a vibrating arm 112. The piezoelectric piece 110 can be made of a piezoelectric material, for example, crystal.

The piezoelectric piece 110 vibrates when electric power is supplied. Electric power is supplied through an electrode on the base 111 and delivered to an electrode on the vibrating arm 112. Accordingly, the vibrating arm 112 is vibrated to subsequently generate a resonance frequency.

The vibrating arm 112 can be formed in a pair, and the pair of vibrating arms 112 can be arranged to be parallel to each other, in which case the base 111 can be a portion through which the pair of vibrating arms 112 are connected to each other.

Referring to FIG. 2, the vibrating arm 112 can have a groove 120 formed therein. The groove 120 is a concave area that is formed at a portion of the vibrating arm 112. In the case where the vibrating arm 112 is formed in a pair, the groove 120 can be formed in each of the pair of vibrating arms 112. Moreover, the groove 120 can be formed on both one surface and the other surface of the vibrating arm 112.

Owing to the groove 120, the distance between the electrodes can be reduced, and subsequently the resistance of the piezoelectric piece 110 can be reduced.

One surface inside the groove 120 can include a first slope and a second slope. The first slope is extended from an upper portion of the groove 120 in a lower direction so as to have a first angle $\alpha1$. The second slope is extended from a lower portion of the first slope in a lower direction so as to have a second angle $\alpha2$. In such a case, the second angle $\alpha2$ is greater than the first angle $\alpha1$.

As illustrated in FIG. 2, the first angle $\alpha1$ and the second angle $\alpha2$ are angles of the slopes measured from a vertical line from a bottom of the groove 120, in a cross-sectional view of the piezoelectric piece 110.

In the case where the piezoelectric piece 110 is made of crystal and the groove 120 is formed by etching the piezoelectric piece 110, the groove 120 having the first slope and the second slope can be formed by using the characteristics of crystal.

The rate of a depth (h2) of the first slope for a depth (h1) of the groove 120 can be greater than or equal to 0.5 and less than or equal to 1.

TABLE 1

| Depth of 1$^{st}$ Slope (μm) | Rate of Depth (%) | Resistance (kohm) |
|---|---|---|
| 1 | 2 | 175 |
| 3 | 7 | 160 |
| 5 | 11 | 148 |
| 10 | 23 | 137 |
| 15 | 34 | 125 |
| 20 | 45 | 115 |
| 22 | 50 | 90 |
| 24 | 55 | 85 |
| 26 | 59 | 80 |
| 28 | 64 | 76 |
| 30 | 68 | 72 |
| 35 | 80 | 62 |
| 40 | 91 | 52 |
| 44 | 100 | 41 |

The above [Table 1] shows data for the depth (h2) of the first slope, the rate (%) of the depth (h1) of the groove 120 and the depth (h2) of the first slope, and the resistance, when the depth (h1) of the groove 120 is 45 μm. According to [Table 1], the section in which the resistance is 90 kohm or less is the section where the rate of the depth (h1) of the first groove 120 and the depth (h2) of the first slope is greater than or equal to 0.5 and less than or equal to 1.

The piezoelectric vibrator 100 is used with an oscillator circuit, in which case the piezoelectric oscillator 100 and the oscillator circuit need to be matched with each other in order for the oscillator circuit of the piezoelectric oscillator 100 to be operable. The maximum resistance for the tuning fork type of piezoelectric vibrator 100 to be matched with the oscillator circuit is 90 kohm. It is not possible for the oscillator circuit to operate normally if the resistance is excessively greater than 90 kohm.

Therefore, in [Table 1], the piezoelectric vibrator 100 can have normal functions when the rate of the depth (h1) of the first groove 120 and the depth (h2) of the first slope is greater than or equal to 0.5 and less than or equal to 1, in which the resistance of the piezoelectric piece 110 is 90 kohm or less.

In the case where the one surface inside the groove 120 has a shape described above, the distances between the electrodes in the upper portion and lower portion of the groove 120 are almost the same. Accordingly, the resistance can be sufficiently small below 90 kohm.

The first angle α1 can be 10° or less.

TABLE 2

| Depth of 1st Slope (μm) | Rate of Depth (%) | Resistance (kohm) |
| --- | --- | --- |
| 1 | 2 | 182 |
| 3 | 7 | 178 |
| 5 | 11 | 174 |
| 10 | 23 | 163 |
| 15 | 34 | 153 |
| 20 | 45 | 143 |
| 22 | 50 | 139 |
| 24 | 55 | 135 |
| 26 | 59 | 130 |
| 28 | 64 | 126 |
| 30 | 68 | 122 |
| 35 | 80 | 112 |
| 40 | 91 | 102 |
| 44 | 100 | 94 |

[Table 2] shows resistance of the piezoelectric piece 110 when the first angle α1 of the first slope is formed to be 10°, which is greater than 10°. In such a case, the resistance of the piezoelectric piece 110 exceeds 90 kohm, regardless of the rate of the depth (h1) of the first groove 120 and the depth (h2) of the first slope. According to the above-described principle, the piezoelectric vibrator 100 operates efficiently when the first angle α1 is 10° or less.

As described above, the effect of the distances between the electrodes in the upper portion and lower portion of the groove 120 becoming nearly the same can be maximized when the first angle α1 is 10° or less. Particularly, since an inner wall of the groove 120 is formed vertically from the bottom of the groove 120 if the first angle α1 is 0°, the distances between the electrodes measured in the upper portion and lower portion of the groove 120 can be exactly the same. In such a case, the resistance can be sufficiently small.

As illustrated in FIG. 2, the other surface inside the groove 120 that faces the one surface inside the groove 120 can include a surface that is vertical from the bottom of the groove 120. In case where the piezoelectric piece 110 is made of crystal, the shape of the other surface inside the groove 120 can be determined by the physical properties of crystal.

Moreover, the groove 120 can be provided in plurality. In the case where the groove 120 is provided in plurality, a wall 123 can be formed in between the grooves 120, as shown in FIG. 2. Said wall 123 can function as a weight.

The groove 120 can have a protruded part 160 (see FIG. 11) formed on the bottom thereof. The protruded part 160 can be formed in such a way that a cross-section thereof becomes wider toward the bottom of the groove 120 and an end part thereof is sharp.

As described above, the groove 120 can be formed on both one surface and the other surface of the vibrating arm 112. In such a case, the shape of the groove 120 formed on one surface of the vibrating arm 112 can be symmetrical to the shape of the groove 120 formed on the other surface of the vibrating arm 112. In other words, the first slope and the second slope can be formed on one surface inside every groove 120.

Meanwhile, as shown in FIG. 3, the groove 120 formed on one surface of the vibrating arm 112 and the groove 120 formed on the other surface of the vibrating arm 112 can be asymmetrical to each other. That is, the number of grooves 120 formed on one surface of the vibrating arm 12 can be different from the number of grooves 120 formed on the other surface of the vibrating arm 112. As such, the piezoelectric piece 110 can be manufactured in various shapes.

As described above, with the grooves 120 having the first slope and the second slope in accordance with some embodiments of the present invention, the resistance can be sufficiently reduced.

Hitherto, the piezoelectric piece 110 in accordance with some embodiments of the present invention has been described. Hereinafter, a method of manufacturing the piezoelectric piece 110 in accordance with an embodiment of the present invention will be described.

Figure 4:
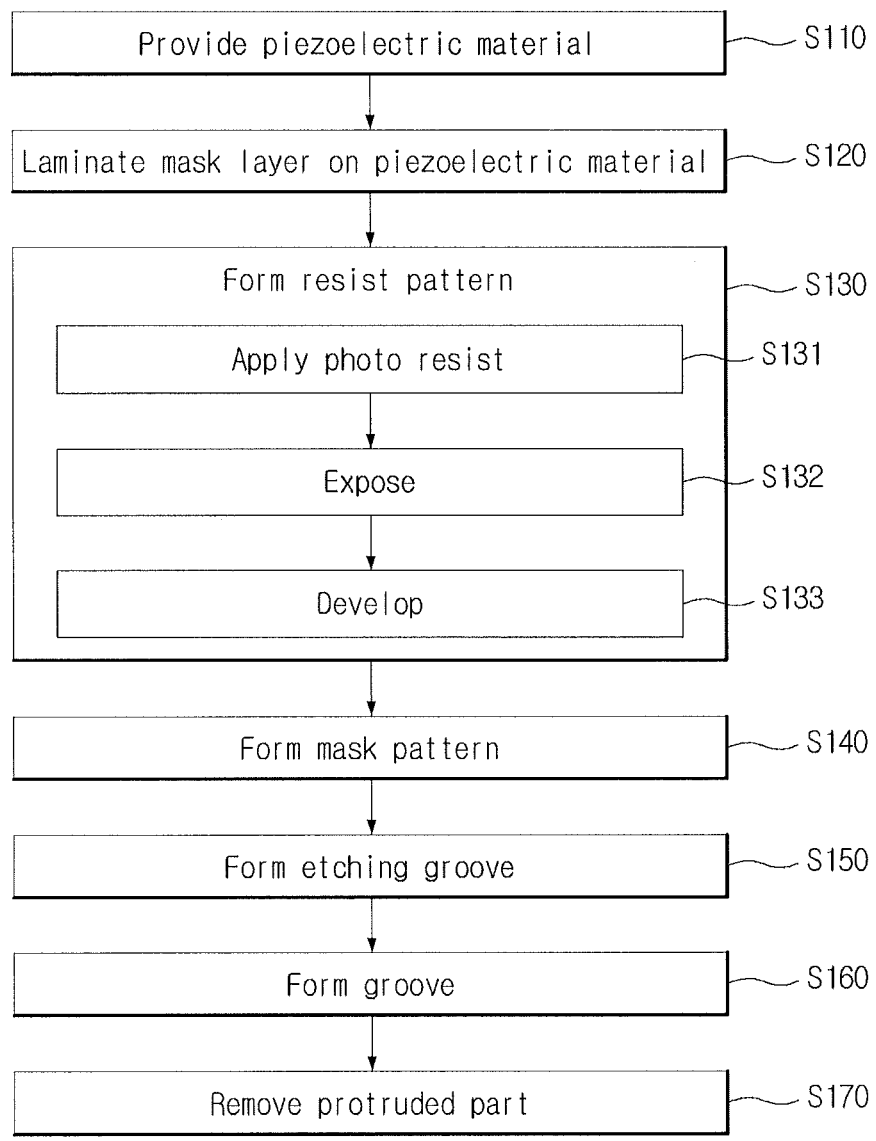
FIG. 4 is a flow diagram showing a method of manufacturing a piezoelectric piece for a piezoelectric vibrator in accordance with an embodiment of the present invention.

FIG. 4 is a flow diagram showing a method of manufacturing a piezoelectric piece for a piezoelectric vibrator in accordance with an embodiment of the present invention, and FIG. 5 to FIG. 13 show processes for the method of manufacturing a piezoelectric piece for a piezoelectric vibrator in accordance with an embodiment of the present invention.

Referring to FIG. 4, the method of manufacturing the piezoelectric piece 110 for a piezoelectric vibrator in accordance with an embodiment of the present invention can include the steps of: providing a piezoelectric material 130 (S110); laminating a mask layer 140 on the piezoelectric material 130 (S120); forming a resist pattern 151 on the mask layer 140 (S130); forming a mask pattern 141 (S140); forming an etching groove A (S150); forming a groove 120 (S160); and removing a protruded part 160 (S170).

In the step of providing the piezoelectric material 130 (S110), the piezoelectric material 130 including the base 111 and the vibrating arm 112 is prepared. The piezoelectric material 130 can be a material including crystal. The vibrating arm 112 is the part that actually vibrates and is extended from the base 111.

Figure 5:
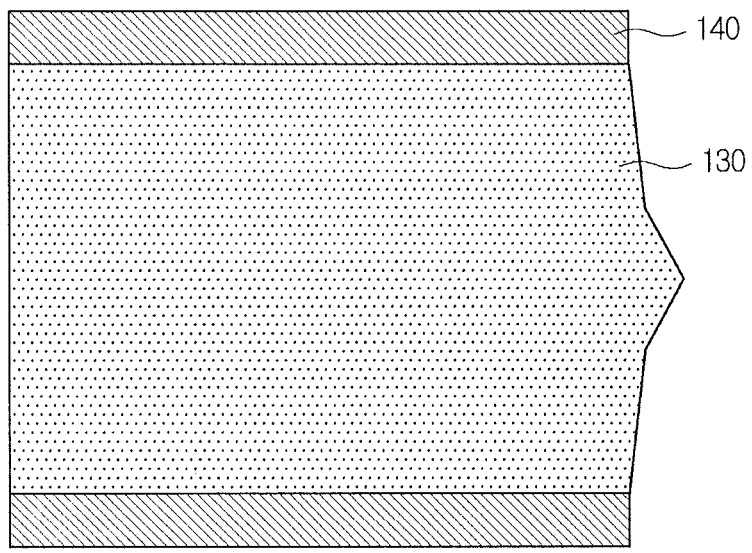
FIG. 5 to FIG. 13 show processes for the method of manufacturing a piezoelectric piece for a piezoelectric vibrator in accordance with an embodiment of the present invention.

As illustrated in FIG. 5, in the step of laminating the mask layer 140 on the piezoelectric material 130 (S120), the mask layer 140 is laminated on an entire upper surface of the piezoelectric material 130 in order to form the mask pattern 141. In such a case, the mask layer 140 can be metal including copper (Cu) and gold (Au).

In the step of forming the resist pattern 151 on the mask layer 140 (S130), the resist pattern 151 is pre-formed on the mask layer 140 in order to eventually form the mask pattern 141. In such a case, the resist pattern 151 can have the same pattern as the mask pattern 141.

The step of forming the resist pattern 151 (S130) can include the steps of: applying photo resist 150 on the mask layer 140 (S131); exposing the photo resist 150 (S132); and developing the photo resist 150 (S133).

Figure 6:
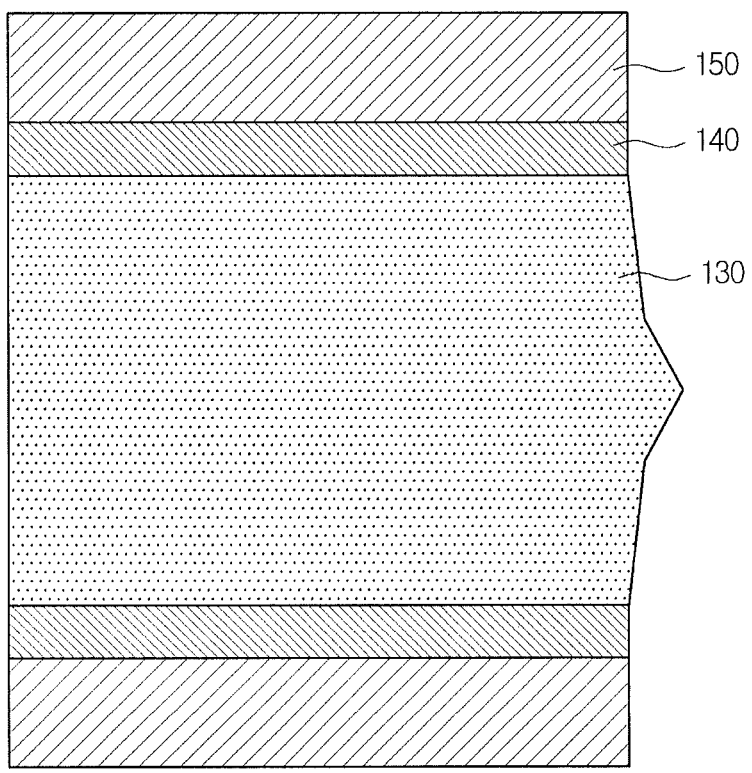

As illustrated in FIG. 6, in the step of applying the photo resist 150 on the mask layer 140 (S131), the photo resist 150 is applied to an entire upper surface of the mask layer 140. The photo resist 150 can be applied using a spray method.

In the step of exposing the photo resist 150 (S132), ultraviolet rays are irradiated to the photo resist 150 excluding the resist pattern 151. Here, a photo mask can be used to shield the resist pattern 151 from the ultraviolet rays.

Figure 7:
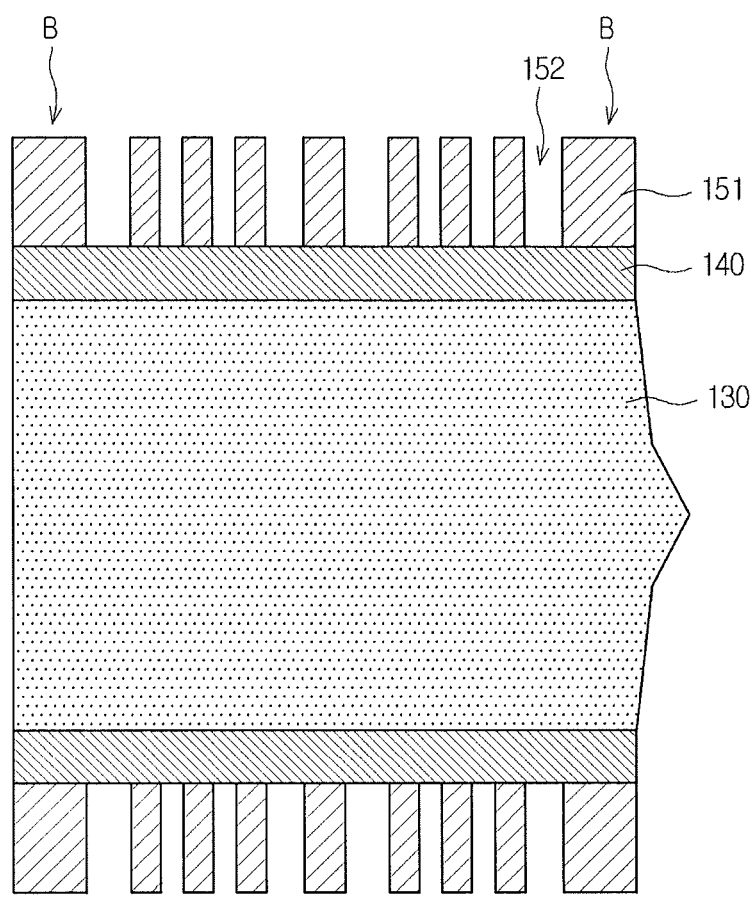

As shown in FIG. 7, in the step of developing the photo resist 150 (S133), the photo resist 150 excluding the resist pattern 151 is removed. The photo resist 150 excluding the resist pattern 151 can be removed by a developing solution. That is, areas of the photo resist 150 that are irradiated by the ultraviolet rays in the exposing step are only removed. FIG. 7 shows resist-removed areas 152.

Figure 8:
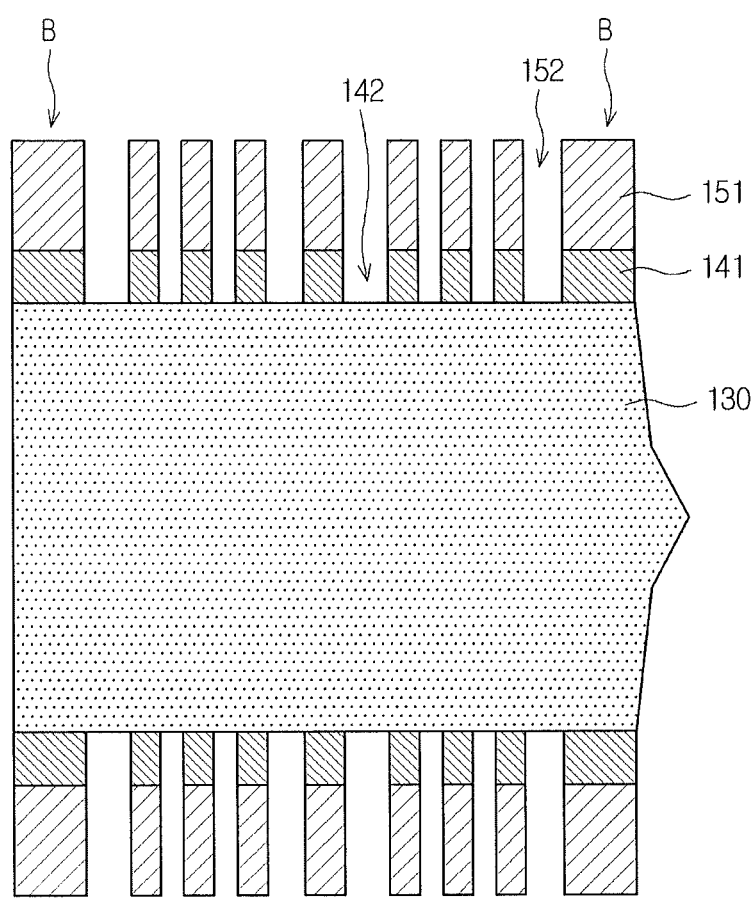

As illustrated in FIG. 8, in the step of forming the mask pattern 141 (S140), the mask pattern 141 is formed by removing some of the mask layer 140. Here, the mask pattern 141 is formed in such a way that a plurality of openings 142 are separated and arranged in between both ends (B) in a widthwise direction of the vibrating arm 112. Moreover, the mask pattern 141 is formed to correspond to the resist pattern 151.

Figure 9:
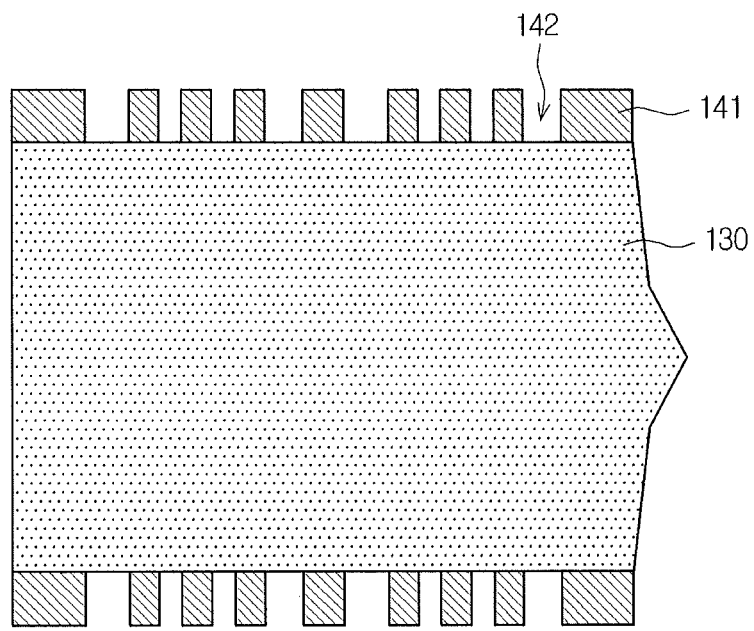

As illustrated in FIG. 9, the resist pattern 151 can be removed after the step of forming the mask pattern 141 (S140), in which case the resist pattern 151 can be exfoliated.

Figure 10:
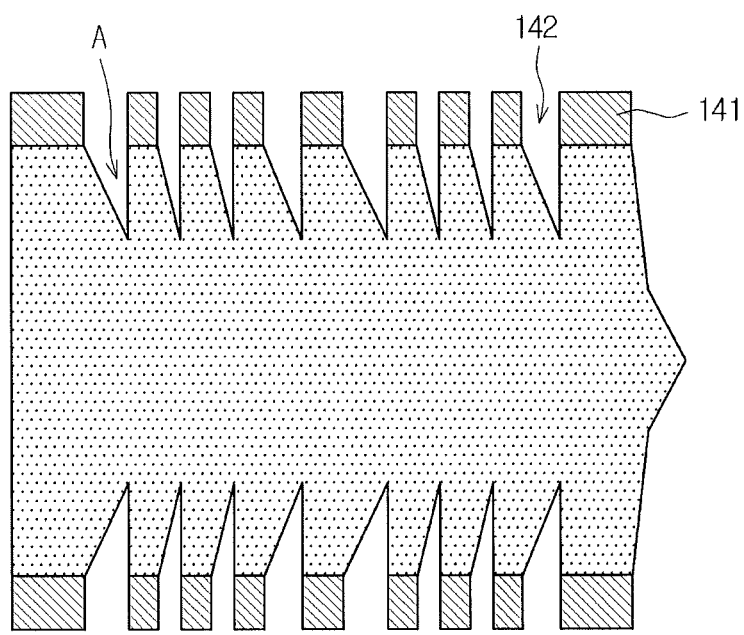

Referring to FIG. 10, in the step of forming the etching groove A (S150), the vibrating arm 112 is etched in a thickness direction of the vibrating arm 112 to form the etching groove A in the vibrating arm 112 so as to correspond to the opening 142 of the mask pattern 141. The etching groove A is formed in the shape of a wedge, by etching a portion of the opening 142 of the mask pattern 141.

Figure 11:
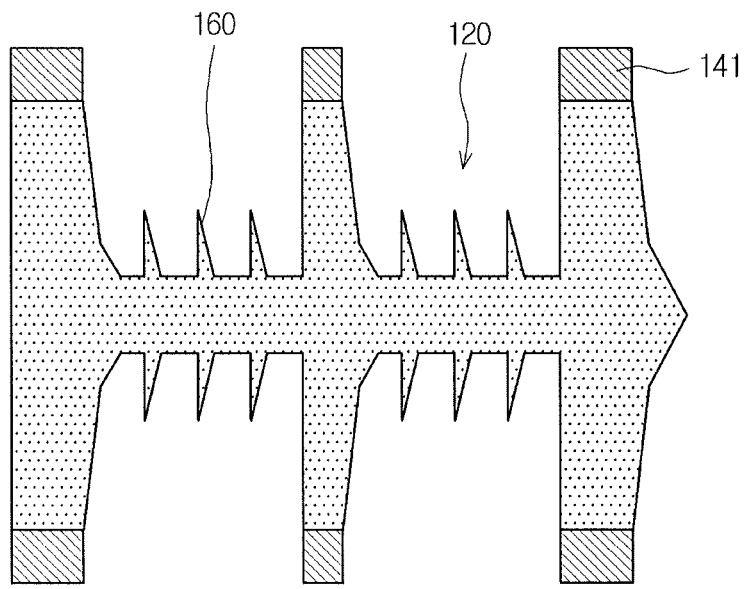

Referring to FIG. 11, in the step of forming the groove 120 (S160), the groove 120 is formed in the vibrating arm 112 by continuously etching the etching groove A in the thickness direction of the vibrating arm 112 and having adjacent etching grooves A connected to each other. In other words, as the etching groove A is continued to be etched, the etching groove A is etched deeper and wider, and boundaries between adjacent etching grooves A are eliminated. Eventually, the single groove 120 can be formed from the plurality of etching grooves A.

Here, the step of forming the etching groove A (S150) and the step of forming the groove 120 (S160) can be performed successively.

In the case where the piezoelectric piece 110 is made of crystal and the groove 120 is formed from the plurality of etching grooves A, the inner wall of the groove 120 can have a nearly vertical shape. This is because the slope on the inner wall of the groove 120 becomes closer to a vertical line if the etching groove A is etched for a longer duration when the groove 120 is formed. When the inner wall of the groove 120 has a nearly vertical slope, the distances between the electrodes measured in the upper portion and lower portion of the groove 120 would be nearly the same, and thus the resistance of the piezoelectric piece 110 can be reduced.

Meanwhile, formed on the one surface inside the groove 120 can be the first slope, which is extended from the upper portion of the groove 120 in the lower direction so as to have the first angle $\alpha 1$, and the second slope, which is extended from the lower portion of the first slope in the lower direction so as to have the second angle $\alpha 2$ that is greater than the first angle $\alpha 1$.

The groove 120 can be formed in plurality on the vibrating arm 112. Moreover, the groove 120 can be formed on one surface and the other surface, respectively, of the vibrating arm 112. Here, the groove 120 formed on the one surface of the vibrating arm 112 and the groove 120 formed on the other surface of the vibrating arm 112 can be structured to be symmetrical to each other.

Moreover, it is possible that the groove 120 formed on the one surface of the vibrating arm 112 and the groove 120 formed on the other surface of the vibrating arm 112 are asymmetrical to each other. In such a case, it is possible that the number of grooves 120 formed on the one surface of the vibrating arm 112 and the number of grooves 120 formed on the other surface of the vibrating arm 112 are different from each other.

Figure 12:
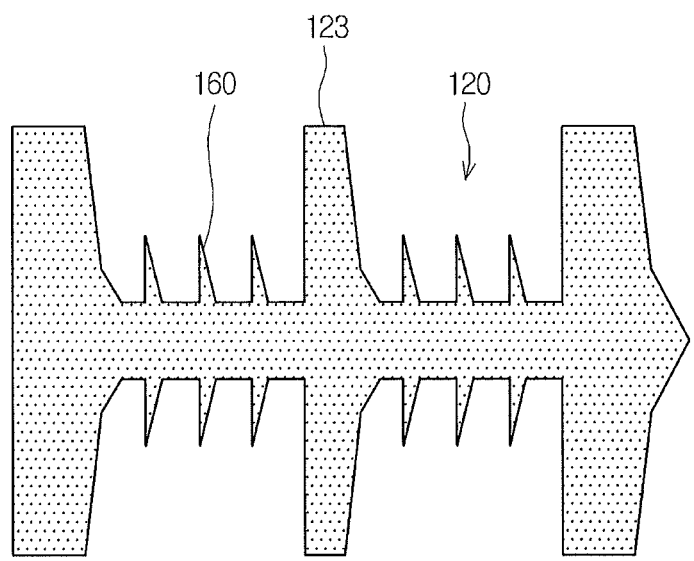

As illustrated in FIG. 12, there can be an additional step of removing the mask pattern 141 after the step of forming the groove 120 (S160). Although some portions of the mask pattern 141 can be removed when the groove 120 is formed on the vibrating arm 112, there can be other portions of the mask pattern 141 (e.g., portions located on either end of the vibrating arm 112) that are not removed. In such a case, the step of removing the mask pattern 141 may be required. The mask pattern 141 can be removed by etching.

Meanwhile, the step of forming the groove 120 can include a step of forming the protruded part 160 on the bottom of the groove 120. The protruded part 160 can be formed in such a shape that a cross-section of the protrude part 160 becomes wider toward the bottom of the groove 120 and that an end portion of the protruded part 160 has a sharp point.

In the case where the groove 120 is formed from the etching groove A, it is possible that some of the portions covered by the mask pattern 140 are remained as the protruded part 160 on the bottom of the groove 120. The protruded part 160 can provide diverse shapes of the piezoelectric piece 110.

Figure 13:
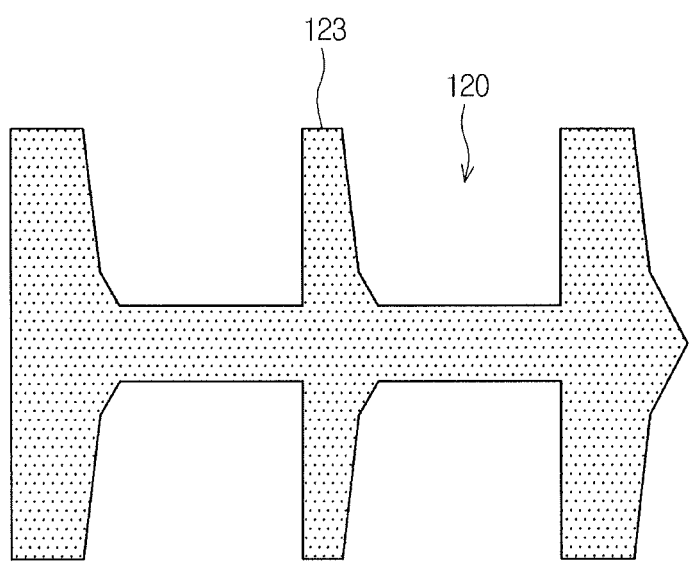

Referring to FIG. 13, in the step of removing the protruded part 160 (S170), the protruded part 160 formed on the bottom of the groove 120 is removed after the step of forming the groove 120 in the vibrating arm 112. This step may or may not be included depending on the requirement by a user.

As described above, the method of manufacturing a piezoelectric piece for a piezoelectric vibrator in accordance with an embodiment of the present invention can allow a piezoelectric piece in which the distance between the electrodes is narrow to be readily manufactured. Accordingly, the piezoelectric piece can be smaller, and the yield of the piezoelectric vibrator can be improved.

Although certain embodiments of the present invention have been described, it shall be appreciated that a number of permutations and modifications of the present invention are possible by those who are ordinarily skilled in the art to which the present invention pertains by supplementing, modifying, deleting and/or adding some elements without departing from the technical ideas of the present invention that are disclosed in the claims appended below and that such permutations and modifications are also covered by the scope of the present invention.

What is claimed is:

1. A piezoelectric piece for a piezoelectric vibrator, comprising:
   a base; and
   a vibrating arm connected to the base and having a plurality of grooves formed in one surface thereof, wherein the grooves comprise one surface, other surfaces facing the one surface, and a bottom connecting the one surface to the other surfaces, wherein the one surface inside the grooves comprise:
   a first slope extended from an upper portion of the groove in a lower direction so as to have a first angle being 10° or less;
   a second slope extended from a lower portion of the first slope in a lower direction so as to have a second angle that is greater than the first angle,
   and the other surfaces inside the grooves are formed to include a surface that is vertical from the bottom of the groove,
   wherein a rate of a depth of the first slope for a depth of the groove is greater than or equal to 0.5 and less than or equal to 1.

2. The piezoelectric piece for a piezoelectric vibrator of claim 1, wherein the groove has a protruded part formed on the bottom thereof, the protruded part being formed in such a manner that a cross-section thereof becomes wider toward the bottom of the grooves.

3. The piezoelectric piece for a piezoelectric vibrator of claim 1, wherein the groove is formed on one surface and the other surface of the vibrating arm, respectively.

4. The piezoelectric piece for a piezoelectric vibrator of claim 3, wherein the shape of the groove formed on the one surface of the vibrating arm is symmetrical to the shape of the groove formed on the other surface of the vibrating arm.

5. The piezoelectric piece for a piezoelectric vibrator of claim 3, wherein the number of the grooves formed on the one surface of the vibrating arm is different from the number of the grooves formed on the other surface of the vibrating arm.

\* \* \* \* \*